US012653073B2

(12) United States Patent
Lee

(10) Patent No.: US 12,653,073 B2
(45) Date of Patent: Jun. 9, 2026

(54) SEMICONDUCTOR DEVICE INCLUDING TWO OR MORE SEMICONDUCTOR STRUCTURES THAT ARE STACKED ONE ON ANOTHER AND METHOD FOR FABRICATING THE SAME

(71) Applicant: SK hynix Inc., Gyeonggi-do (KR)

(72) Inventor: Hee Sun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 481 days.

(21) Appl. No.: 18/297,012

(22) Filed: Apr. 7, 2023

(65) Prior Publication Data

US 2024/0153915 A1    May 9, 2024

(30) Foreign Application Priority Data

Nov. 8, 2022    (KR) ........................ 10-2022-0147781

(51) Int. Cl.
*H01L 25/065*    (2023.01)
*H01L 21/768*    (2006.01)
(Continued)

(52) U.S. Cl.
CPC .... *H01L 25/0657* (2013.01); *H01L 21/76898* (2013.01); *H01L 23/481* (2013.01); *H01L 23/5226* (2013.01); *H01L 24/05* (2013.01); *H01L 24/06* (2013.01); *H01L 24/08* (2013.01); *H01L 24/80* (2013.01); *H01L 2224/05611* (2013.01); *H01L 2224/05639* (2013.01); *H01L 2224/05644* (2013.01); *H01L 2224/05647* (2013.01); *H01L 2224/05655* (2013.01); *H01L*

*2224/05684* (2013.01); *H01L 2224/05686* (2013.01); *H01L 2224/06505* (2013.01);
(Continued)

(58) Field of Classification Search
CPC ........... H01L 25/0657; H01L 21/76898; H01L 23/481; H01L 23/5226; H01L 24/05; H01L 24/06; H01L 24/08; H01L 2225/06541; H01L 21/76804; H01L 24/04; H01L 24/07; H01L 2224/08123; H01L 2224/80895
See application file for complete search history.

(56) References Cited

U.S. PATENT DOCUMENTS 8,860,229 B1 * 10/2014 Lin ........................ H01L 24/02
257/774
9,691,733 B1 * 6/2017 Shen ....................... H01L 24/83
(Continued)

FOREIGN PATENT DOCUMENTS

KR    10-2018-0034671 A    4/2018
KR    102211143 B1 *    2/2021 ......... H10F 39/8067

*Primary Examiner* — Mamadou L Diallo

(74) *Attorney, Agent, or Firm* — IP & T GROUP LLP

(57) ABSTRACT

A semiconductor device includes: a first semiconductor structure including a first bonding dielectric layer that is positioned in an uppermost portion of the first semiconductor structure and that includes a first opening; a second semiconductor structure positioned over the first semiconductor structure and including a second bonding dielectric layer that is positioned in a lowermost portion of the second semiconductor structure and that includes a second opening connected to the first opening; a diffusion barrier layer formed along inner walls of the first and second openings; and a metal-containing layer filling the first and second openings where the diffusion barrier layer is formed.

10 Claims, 7 Drawing Sheets

(51) Int. Cl.
    *H01L 23/00*           (2006.01)
    *H01L 23/48*           (2006.01)
    *H01L 23/522*         (2006.01)

(52) U.S. Cl.
    CPC ............... *H01L 2224/06515* (2013.01); *H01L 2224/08145* (2013.01); *H01L 2224/80896* (2013.01); *H01L 2224/80909* (2013.01); *H01L 2225/06524* (2013.01); *H01L 2225/06544* (2013.01); *H01L 2225/06565* (2013.01); *H01L 2924/04941* (2013.01)

(56)          References Cited

U.S. PATENT DOCUMENTS

| | | | | |
|---|---|---|---|---|
| 9,748,206 | B1 * | 8/2017 | Huang | H01L 23/564 |
| 11,646,283 | B2 * | 5/2023 | Hou | H01L 24/08 |
| | | | | 438/612 |
| 2015/0021785 | A1 * | 1/2015 | Lin | H01L 21/76897 |
| | | | | 438/459 |
| 2018/0012868 | A1 * | 1/2018 | Huang | H01L 24/94 |
| 2018/0138224 | A1 * | 5/2018 | Haneda | H01L 24/08 |
| 2019/0109042 | A1 * | 4/2019 | Katkar | H01L 21/76831 |
| 2020/0395295 | A1 * | 12/2020 | Tsai | H01L 24/17 |
| 2021/0066222 | A1 * | 3/2021 | Chen | H01L 21/76879 |
| 2021/0098407 | A1 * | 4/2021 | Elsherbini | H01L 25/0652 |
| 2021/0384137 | A1 * | 12/2021 | Choi | H01L 23/293 |
| 2021/0407942 | A1 * | 12/2021 | Yu | H01L 24/19 |
| 2023/0066256 | A1 * | 3/2023 | Chiu | H01L 21/76831 |
| 2023/0187395 | A1 * | 6/2023 | Kabir | H01L 21/76829 |
| | | | | 257/741 |
| 2023/0223345 | A1 * | 7/2023 | Lee | H10B 41/27 |
| | | | | 257/314 |
| 2023/0253353 | A1 * | 8/2023 | Hou | H01L 24/05 |
| | | | | 257/690 |
| 2023/0253361 | A1 * | 8/2023 | Rogers | H01L 24/80 |
| | | | | 438/107 |
| 2023/0361069 | A1 * | 11/2023 | Ishikawa | H01L 24/08 |
| 2023/0386999 | A1 * | 11/2023 | Tsai | H01L 25/50 |
| 2023/0387051 | A1 * | 11/2023 | Tsai | H01L 21/76885 |
| 2024/0055406 | A1 * | 2/2024 | Kim | H01L 24/03 |
| 2024/0090228 | A1 * | 3/2024 | Choi | H10B 41/27 |
| 2025/0157957 | A1 * | 5/2025 | Kwon | H01L 24/83 |

* cited by examiner 276
280
236
240
220
211
210
212

S21'

OP2

280

240
220
211
210
212

S21'

OP1

SEMICONDUCTOR DEVICE INCLUDING TWO OR MORE SEMICONDUCTOR STRUCTURES THAT ARE STACKED ONE ON ANOTHER AND METHOD FOR FABRICATING THE SAME

CROSS-REFERENCE TO RELATED APPLICATIONS

The present application claims priority of Korean Patent Application No. 10-2022-0147781, filed on Nov. 8, 2022, which is incorporated herein by reference in its entirety.

BACKGROUND

1. Field

Various embodiments of the present disclosure relate to a semiconductor device, and more particularly, to a semiconductor device including two or more semiconductor structures that are stacked one on another.

2. Description of the Related Art

Electronic products are becoming smaller in size and are able to process high-capacity data. Accordingly, semiconductor structures, such as semiconductor chips, wafers and the like, that are used in these electronic products have a small thickness and a small size. Furthermore, a form of embedding a plurality of semiconductor structures in one semiconductor device is being realized.

These plurality of semiconductor structures are electrically connected to each other while being stacked in a vertical direction.

SUMMARY

Embodiments of the present disclosure are directed to a providing a semiconductor device that has excellent electrical connection characteristics of a bonding pad that connects two semiconductor structures and can prevent metal diffusion from the bonding pad to a bonding dielectric layer, and a method for fabricating the same.

In accordance with one embodiment of the present disclosure, a semiconductor device includes: a first semiconductor structure including a first bonding dielectric layer that is positioned in an uppermost portion of the first semiconductor structure and that includes a first opening; a second semiconductor structure positioned over the first semiconductor structure and including a second bonding dielectric layer that is positioned in a lowermost portion of the second semiconductor structure and that includes a second opening connected to the first opening; a diffusion barrier layer formed along inner walls of the first and second openings; and a metal-containing layer filling the first and second openings where the diffusion barrier layer is formed.

In accordance with another embodiment of the present disclosure, a method for fabricating a semiconductor device includes: providing an initial first semiconductor structure which includes first sacrificial pads and a first bonding dielectric layer filling a space between the first sacrificial pads, the first sacrificial pads and the first bonding dielectric layer being positioned in an uppermost portion of the initial first semiconductor structure; forming second sacrificial pads and a second bonding dielectric layer filling a space between the second sacrificial pads over the initial first semiconductor structure; forming first and second openings by removing the first and second sacrificial pads; forming a diffusion barrier layer formed along inner walls of the first and second openings; and forming a metal-containing layer filling the first and second openings in which the diffusion barrier layer is formed.

In accordance with still another embodiment of the present disclosure, a method for fabricating a semiconductor device includes: providing an initial first semiconductor structure that includes first sacrificial pads positioned in an uppermost portion of the first semiconductor structure, a first bonding dielectric layer filling a space between the first sacrificial pads, and a first sacrificial through electrode penetrating at least a portion of the first semiconductor structure except for the uppermost portion and connected to the first sacrificial pads; forming an initial second semiconductor structure that includes second sacrificial pads positioned in a lowermost portion of the second semiconductor structure, a second bonding dielectric layer filling a space between the second sacrificial pads, and a second sacrificial through electrode penetrating a portion of the second semiconductor structure except for the lowermost portion and connected to the second sacrificial pads, over the initial first semiconductor structure; forming first and second openings by removing the first and second sacrificial pads and the first and second sacrificial through electrodes; forming a diffusion barrier layer along inner walls of the first and second openings; and forming a metal-containing layer filling the first and second openings in which the diffusion barrier layer is formed.

DETAILED DESCRIPTION

Figure 1A:
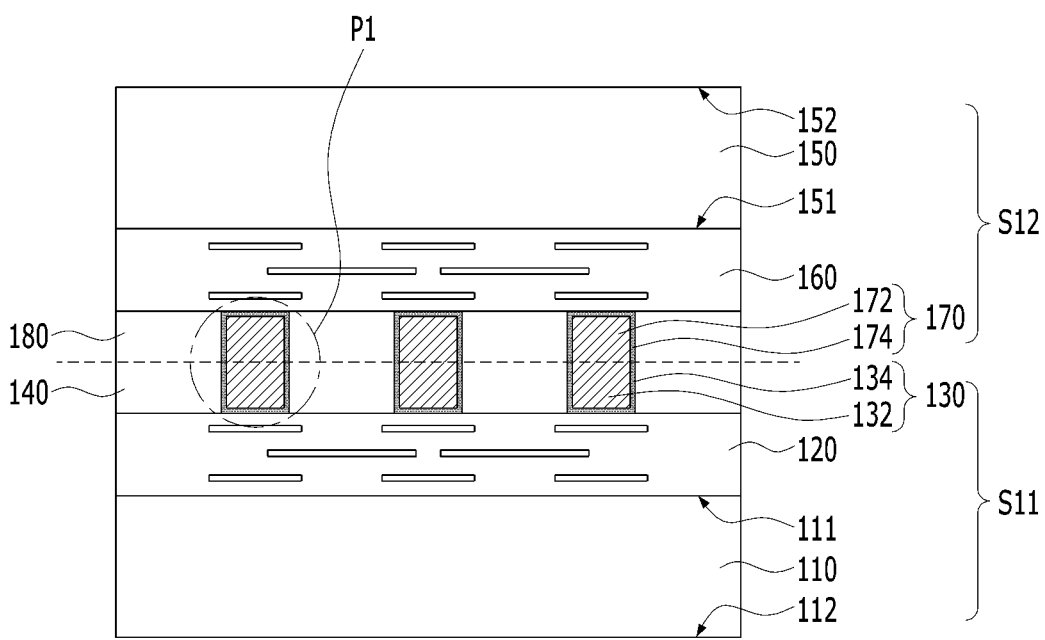
FIG. 1A is a cross-sectional view illustrating a semiconductor device in accordance with one embodiment of the present disclosure.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will convey the scope of the present disclosure to those skilled in the art. Throughout the disclosure, like reference numerals refer to like parts throughout the diverse figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following description, a semiconductor structure may mean a semiconductor wafer, a semiconductor chip and the like that includes an integrated circuit capable of performing a predetermined function. Also, the semiconductor device may include two or more semiconductor structures that are stacked in a vertical direction and electrically connected to each other. Hereinafter, these semiconductor structures will be described in more detail with reference to the drawings.

Figure 1B:
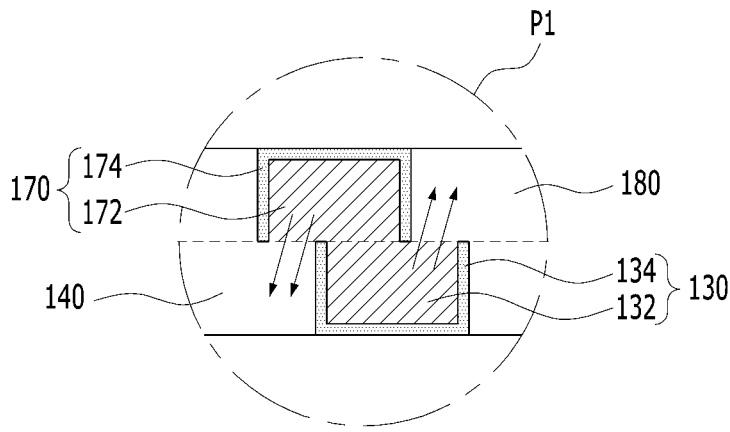
FIG. 1B is an enlarged view of a portion of FIG. 1A.

FIG. 1A is a cross-sectional view illustrating a semiconductor device in accordance with one embodiment of the present disclosure. FIG. 1B is an enlarged view of a portion of FIG. 1A.

Referring to FIG. 1A, a semiconductor device may include a first semiconductor structure S11 and a second semiconductor structure S12 which is positioned over the first semiconductor structure S11.

The first semiconductor structure S11 may include a first semiconductor substrate 110, a first circuit 120, a first bonding pad 130, and a first bonding dielectric layer 140.

The first semiconductor substrate 110 may include a semiconductor material, such as for example silicon or germanium, and may have a front surface 111, a rear surface 112, and side surfaces connecting the front surface 111 and the rear surface 112 to each other. The front surface 111 may correspond to an active surface on which the first circuit 120 is positioned. The rear surface 112 may correspond to an inactive surface which is positioned opposite to the front surface 111. According to this embodiment of the present disclosure, the first semiconductor substrate 110 may be positioned such that the front surface 111 faces upward and the rear surface 112 faces downward. However, the present disclosure is not limited thereto. According to another embodiment of the present disclosure, the front surface 111 may face downward and the rear surface 112 may face upward. In this embodiment, the first circuit 120, which is to be described below, may be positioned below the first semiconductor substrate 110 so as to be adjacent to the front surface 111.

The first circuit 120 may be positioned on the front surface 111 of the first semiconductor substrate 110. The first circuit 120 may include an integrated circuit that performs diverse functions, such as for example data storage and data processing. The first circuit 120 may be formed of a combination of one or more unit elements, such as a transistor, a capacitor, and a diode, one or more conductive patterns that are connected to the unit elements, and one or more dielectric layers where the unit elements and the conductive patterns are buried. For the sake of convenience in description, unit elements and the conductive patterns in the first circuit 120 are briefly illustrated as lines in the drawing, but the the present disclosure is not limited to those shown in the drawing, and according to the type of the first semiconductor structure S11, the first circuit 120 may be realized in diverse ways. For example, when the first semiconductor structure S11 includes a volatile memory, such as for example a DRAM (Dynamic Random Access Memory), an SRAM (Static RAM), or a non-volatile memory, such as a NAND flash, a RRAM (Resistive RAM), a PRAM (Phase-change RAM), an MRAM (Magneto-resistive RAM), an FRAM (ferroelectric RAM) and the like, the first circuit 120 may include a memory cell array including a plurality of memory cells. In another example, when the first semiconductor structure S11 is a logic structure including a peripheral circuit for driving a memory or a controller, the first circuit 120 may include a peripheral circuit.

As shown in FIG. 1A, the first bonding pad 130 may be formed over the first circuit 120. Unlike the drawing, when the first circuit 120 is positioned below the first semiconductor substrate 110, the first bonding pad 130 may be formed directly over the first semiconductor substrate 110. The first bonding pad 130 may be electrically connected to the first circuit 120. Also, at least one among the first bonding pad 130 may correspond to a dummy bonding pad that is not electrically connected to the first circuit 120 but performs only a bonding function with a second bonding pad 170, which will be described later.

The first bonding pad 130 may be provided for electrically and/or physically connecting the first semiconductor structure S11 to the second semiconductor structure S12. The first bonding pad 130 may include diverse conductive materials. In one particular embodiment, when the first bonding pad 130 is directly bonded to the second bonding pad 170 of the second semiconductor structure S12 to form a hybrid-bonding structure, the first bonding pad 130 may include a metal material that may be bonded to the second bonding pad 170 by inter-diffusion of a metal through a high-temperature annealing process, for example, copper (Cu), nickel (Ni), tin (Sn), gold (Au), silver (Ag), a combination thereof, or a compound thereof. When the first bonding pad 130 includes a metal having a high diffusion rate into a dielectric material, such as copper (Cu), diffusion of the metal into the first bonding dielectric layer 140 may occur. In one embodiment, to prevent this from occurring, the first bonding pad 130 may include a first metal-containing layer 132 and a first diffusion barrier layer 134. The first metal-containing layer 132 may include the aforementioned metal materials, such as for example copper (Cu), nickel (Ni), tin (Sn), gold (Au), silver (Ag), a combination thereof, or a compound thereof. The first diffusion barrier layer 134 may be a material capable of preventing the diffusion of the metal material which is described above. For example, the first diffusion barrier layer 134 may include tantalum (Ta), titanium nitride (TiN), tantalum nitride (TaN), tungsten nitride (WN), ruthenium oxide ($RuO_2$), tantalum silicon nitride (TaSiN), titanium silicon nitride (TiSiN), tungsten boron nitride (TBN), cobalt tungsten boride (CoWB), or a combination thereof. The first diffusion barrier layer 134 may be interposed between at least the first bonding dielectric layer 140 and the first metal-containing layer 132. To take an example, as illustrated, the first diffusion barrier layer 134 may be formed along the profile of the sidewall and bottom surfaces of the first metal-containing layer 132 to surround those surfaces of the first metal-containing layer 132, as shown in FIG. 1A.

As shown in FIG. 1A, the first bonding dielectric layer 140 may be formed to fill the space between the first bonding pad 130 over the first circuit 120. The first bonding dielectric layer 140 may include a variety of dielectric materials. In one particular embodiment, when the first bonding dielectric layer 140 is directly bonded to the second bonding dielectric layer 180 of the second semiconductor structure S12 to form a hybrid bonding structure, the first bonding dielectric layer 140 may include a dielectric material that may be combined with the second bonding dielectric layer 180 by a covalent bond. For example, the first bonding dielectric layer 140 may include silicon oxide, silicon nitride, or a combination thereof.

As shown in FIG. 1A, the second semiconductor structure S12 may include a second semiconductor substrate 150, a second circuit 160, a second bonding pad 170, and a second bonding dielectric layer 180.

The second semiconductor substrate 150 may include a semiconductor material, such as for example silicon or germanium, and may include a front surface 151, a rear surface 152, and side surfaces connecting them to each other. The front surface 151 may correspond to an active surface on which the second circuit 160 is positioned. The rear surface 152 may correspond to an inactive surface which is positioned opposite to the front surface 151. According to this embodiment of the present disclosure, the second semiconductor substrate 150 may be positioned such that the front surface 151 faces downward and the rear surface 152 faces upward. Accordingly, the front surface 151 of the second semiconductor substrate 150 may face the front surface 111 of the first semiconductor substrate 110. However, the present disclosure is not limited thereto. According to another embodiment of the present disclosure, the front surface 151 may face upward and the rear surface 152 may face downward. In this case, the second circuit 160, which will be described later, may be positioned over the second semiconductor substrate 150 so as to be adjacent to the front surface 151.

As shown in FIG. 1A, the second circuit 160 may be positioned below the front surface 151 of the second semiconductor substrate 150. The second circuit 160 may include an integrated circuit capable of performing diverse functions, and may be formed of a combination of one or more unit elements, one or more conductive patterns connected to the unit elements, and one or more dielectric layers where the unit elements and the conductive patterns are buried. For the sake of convenience in description, the unit elements and the conductive patterns in the second circuit 160 are briefly shown as lines in the drawing, but the unit elements and the conductive patterns are not limited to those shown in the drawing, and the second circuit 160 may be realized in diverse ways according to the type of the second semiconductor structure S12. The second semiconductor structure S12 may be the same as or different from the first semiconductor structure S11. For example, when the first semiconductor structure S11 includes a memory, the second semiconductor structure S12 may include a memory which is the same as or different from that of the first semiconductor structure S11, or the second semiconductor structure S12 may include a peripheral circuit for driving the memory of the first semiconductor structure S11. Also, when the second semiconductor structure S12 includes a memory, the first semiconductor structure S11 may include a peripheral circuit for driving the memory of the second semiconductor structure S12.

As shown in FIG. 1A, the second bonding pad 170 may be formed below the second circuit 160. Unlike the drawing, when the second circuit 160 is positioned over the second semiconductor substrate 150, the second bonding pad 170 may be formed directly below the second semiconductor substrate 150. A plurality of the second bonding pad 170 may be electrically connected to the second circuit 160. Also, at least one among the second bonding pad 170 may correspond to a dummy bonding pad that is not electrically connected to the second circuit 160 but performs only a bonding function with the first bonding pad 130.

The second bonding pad 170 may be provided for electrically and/or physically connecting the second semiconductor structure S12 to the first semiconductor structure S11. The second bonding pad 170 may respectively correspond to the first bonding pad 130. The second bonding pad 170 may include diverse conductive materials. In one particular embodiment, the second bonding pad 170 may include a metal material that is directly bonded to the first bonding pad 130 to form a hybrid bonding structure. When the second bonding pad 170 includes a metal having a high diffusion rate into a dielectric material, such as copper (Cu), diffusion of the metal into the second bonding dielectric layer 180 may occur. In one embodiment, to prevent this from occurring, the second bonding pad 170 may include a second metal-containing layer 172 and a second diffusion barrier layer 174. The second metal-containing layer 172 may include the aforementioned metal materials, such as for example copper (Cu), nickel (Ni), tin (Sn), gold (Au), silver (Ag), a combination thereof, or a compound thereof. The second diffusion barrier layer 174 may include a material capable of preventing the diffusion of the metal material described above, such as for example, tantalum (Ta), titanium nitride (TiN), tantalum nitride (TaN), tungsten nitride (WN), ruthenium oxide (RuO$_2$), tantalum silicon nitride (TaSiN), titanium silicon nitride (TiSiN), tungsten boron nitride (TBN), cobalt tungsten boride (CoWB), or combinations thereof. The second diffusion barrier layer 174 may be interposed between at least the second bonding dielectric layer 180 and the second metal-containing layer 172. In an example, as illustrated in the drawing, the second diffusion barrier layer 174 may be formed along the sidewall and the upper surfaces of the second metal-containing layer 172 to surround those surfaces of the second metal-containing layer 172, as shown in FIG. 1A.

As shown in FIG. 1A, the second bonding dielectric layer 180 may be formed to fill the space between the second bonding pad 170 below the second circuit 160. The second bonding dielectric layer 180 may include a variety of dielectric materials. In one particular embodiment, when the second bonding dielectric layer 180 is directly bonded to the first bonding dielectric layer 140 of the first semiconductor structure S11 to form a hybrid bonding structure, the second bonding dielectric layer 180 may include a dielectric material that may be combined with the first bonding dielectric layer 140 by a covalent bond.

In the above described first semiconductor structure S11 and the second semiconductor structure S12, the semiconductor device as illustrated in FIG. 1A may be realized, as the first bonding pad 130 and the second bonding pad 170 are bonded while facing each other and the first bonding dielectric layer 140 and the second bonding dielectric layers 180 are bonded while facing each other. To be specific, by performing a high-temperature annealing process while the first bonding pad 130 and the first bonding dielectric layer 140 of the first semiconductor structure S11 contact the second bonding pad 170 and the second bonding dielectric layer 180 of the second semiconductor structure S12, the first bonding pad 130 and the second bonding pad 170 may form a metal-to-metal bonding, and the first bonding dielectric layer 140 and the second bonding dielectric layer 180 may form an insulator-to-insulator bonding. As a result, hybrid bonding (i.e., metal-to-metal bonding and insulator-to-insulator bonding) between the first semiconductor structure S11 and the second semiconductor structure S12 may be performed.

Meanwhile, the semiconductor device of FIG. 1A shows a case where the first semiconductor structure S11 and the second semiconductor structure S12 are normally aligned. In other words, the first bonding pad 130 and the corresponding second bonding pad 170 may have sidewalls that are aligned with each other. However, misalignment between the first bonding pad 130 and the second bonding pad 170 may occur during the bonding process of the first semiconductor structure S11 and the second semiconductor structure S12. Such a misalignment is illustrated in FIG. 1B.

Referring to FIG. 1B, when misalignment occurs between the first bonding pad 130 and the second bonding pad 170, the top surface of a portion of the first metal-containing layer 132 of the first bonding pad 130 may contact the second bonding dielectric layer 180. Also, the bottom surface of a portion of the second metal-containing layer 172 of the second bonding pad 170 may contact the first bonding dielectric layer 140. As a result, despite the existence of the first and second diffusion barrier layers 134 and 174, metal of the first metal-containing layer 132 may be diffused into the second bonding dielectric layer 180 or metal of the second metal-containing layer 172 may be diffused into the first bonding dielectric layer 140, which is problematic.

However, if the first diffusion barrier layer 134 surrounds the entire surface including the upper surface of the first metal-containing layer 132 and the second diffusion barrier layer 174 surrounds the entire surface including the upper surface of the second metal-containing layer 172, the first and second diffusion barrier layers 134 and 174 may exist on the contact interface between the first bonding pad 130 and the second bonding pad 170. As a result, contact resistance between the first bonding pad 130 and the second bonding pad 170 may increase. This is because the metals or metal nitrides that are used as the first and second diffusion barrier layers 134 and 174 generally have a lower conductivity than the first and second metal-containing layers 132 and 172.

In the following embodiments of the present disclosure, a semiconductor device capable of preventing an increase in the contact resistance between bonding pads while preventing diffusion of a metal in a metal-containing layer even when the upper and lower bonding pads are misaligned as described above, and a method for fabricating the semiconductor device will be described.

FIGS. 2A to 2F are cross-sectional views illustrating a semiconductor device and a method for fabricating the same in accordance with another embodiment of the present disclosure. Detailed descriptions on the constituent elements which are substantially the same as those described above will be omitted herein.

First, the method for fabricating a semiconductor device will be described.

Figure 2A:
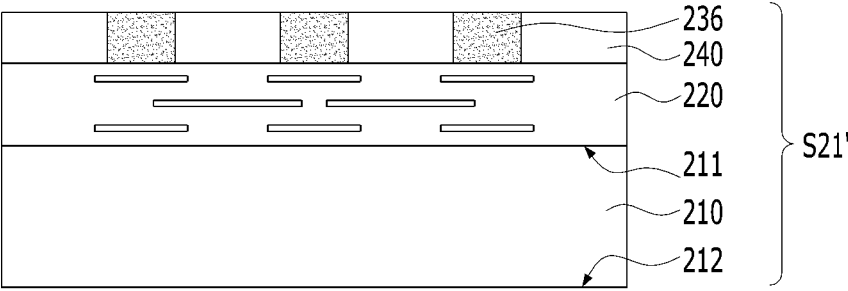
FIGS. 2A to 2F are cross-sectional views illustrating a semiconductor device and a method for fabricating the same in accordance with another embodiment of the present disclosure.

Referring to FIG. 2A, an initial first semiconductor structure S21' may be provided.

The initial first semiconductor structure S21' may include a first semiconductor substrate 210 which is provided with a front surface 211 facing upward, a rear surface 212 facing downward, and side surfaces connecting the front surface 211 and the rear surface 5 212 to each other, a first circuit 220 which is formed over the front surface 211 of the first semiconductor substrate 210, and a first sacrificial pad 236 and a first bonding dielectric layer 240 which are formed over the first circuit 220.

The formation of the first semiconductor substrate 210 and the first circuit 220 may be performed through a typical semiconductor fabrication process, that is, a process of implanting impurities into a semiconductor substrate, a process of depositing a conductive layer and a dielectric layer, and a process of patterning the conductive layer and/or the dielectric layer by performing a mask and etching process.

The first sacrificial pad 236 and the first bonding dielectric layer 240 may be formed by depositing a dielectric material for forming the first bonding dielectric layer 240 over the first circuit 220, selectively etching the deposited dielectric material to provide a space where the first sacrificial pad 236 is to be formed, and then filling the space with a sacrificial material for forming the first sacrificial pad 236. The first sacrificial pad 236 may be replaced with a first bonding pad in the subsequent process, and may be formed of a material that may be removed by a chemical or the like. For example, the first sacrificial pad 236 may include for example a metal material, such as tungsten (W) or a metal nitride, such as titanium nitride (TiN), which may be removed by a stripping process using a wet chemical.

Figure 2B:
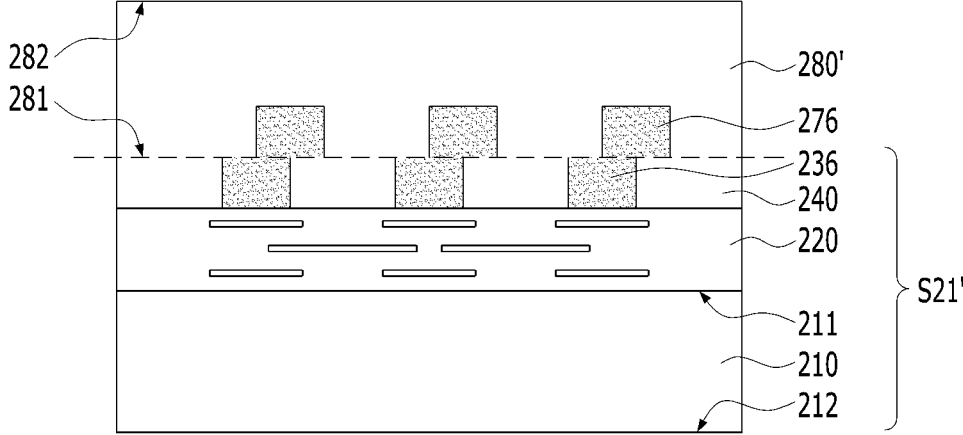

Referring to FIG. 2B, an initial second bonding dielectric layer 280' including a second sacrificial pad 276 buried therein may be positioned over the initial first semiconductor structure S21'.

The initial second bonding dielectric layer 280' may include a first surface 281 facing downward, a second surface 282 positioned opposite to the first surface 281 and facing upward, and side surfaces connecting the first surface 281 and the second surface 282 to each other. The second sacrificial pad 276 may have a bottom surface which is positioned at substantially the same level as the first surface 281 of the initial second bonding dielectric layer 280' and be buried in the initial second bonding dielectric layer 280'. In other words, the second sacrificial pad 276 may have a smaller thickness than a thickness of the initial second bonding dielectric layer 280'. The second sacrificial pad 276 correspond to the first sacrificial pad 236, respectively, so that the bottom surfaces of the second sacrificial pad 276 may be positioned to contact the top surfaces of the first sacrificial pad 236, respectively. The second sacrificial pad 276 may be replaced with a second bonding pad during the subsequent process, and may be formed of a material that may be removed by a chemical or the like. For example, the second sacrificial pad 276 may include a metal material, such as tungsten (W) or a metal nitride, such as titanium nitride (TiN), which may be removed by a stripping process using a wet chemical. The second sacrificial pad 276 may be formed of the same material as that of the first sacrificial pad 236. The upper surface of the first bonding dielectric layer 240 may contact the first surface 281 of the initial second bonding dielectric layer 280'.

In a state that the initial second bonding dielectric layer 280' including the second sacrificial pad 276 buried therein is positioned over the initial first semiconductor structure S21', when a heat treatment process is performed, an insulator-to-insulator bonding may be formed between the first bonding dielectric layer 240 and the initial second bonding dielectric layer 280' based on a covalent bond between dielectric materials. As a result, a bonding between the initial first semiconductor structure S21' and the initial second bonding dielectric layer 280' including the second sacrificial pad 276 buried therein may be formed.

Meanwhile, contrary to what is illustrated, the initial second bonding dielectric layer 280' including the second sacrificial pad 276 buried therein may be formed by etching the initial second bonding dielectric layer 280' to a predetermined depth from the first surface 281 so as to form a space where the second sacrificial pad 276 is to be formed, and then filling the space with a sacrificial material for forming the second sacrificial pad 276, while positioning the first surface 281 of the initial second bonding dielectric layer 280' to face upward and the second surface 282 to face downward.

Subsequently, the structure as illustrated in FIG. 2B may be obtained by turning over the initial second bonding dielectric layer 280' including the second sacrificial pad 276 buried therein to make the first surface 281 face downward and the second surface 282 face upward, and then placing the initial second bonding dielectric layer 280', which is turned over, over the initial first semiconductor structure S21', and performing a heat treatment process.

Here, when the initial second bonding dielectric layer 280' including the second sacrificial pad 276 buried therein is normally aligned over the initial first semiconductor structure S21', the sidewall of the first sacrificial pad 236 and the sidewalls of the second sacrificial pad 276 may be aligned. However, the initial second bonding dielectric layer 280' including the second sacrificial pad 276 buried therein may be positioned to be misaligned over the initial first semiconductor structure S21'. In this case, the sidewall of the first sacrificial pad 236 and the sidewall of the second sacrificial pad 276 may not be aligned. For example, as illustrated in FIG. 2B, the second sacrificial pad 276 may be biased to one side, e.g., to the right side, compared to the first sacrificial pad 236.

Figure 2C:
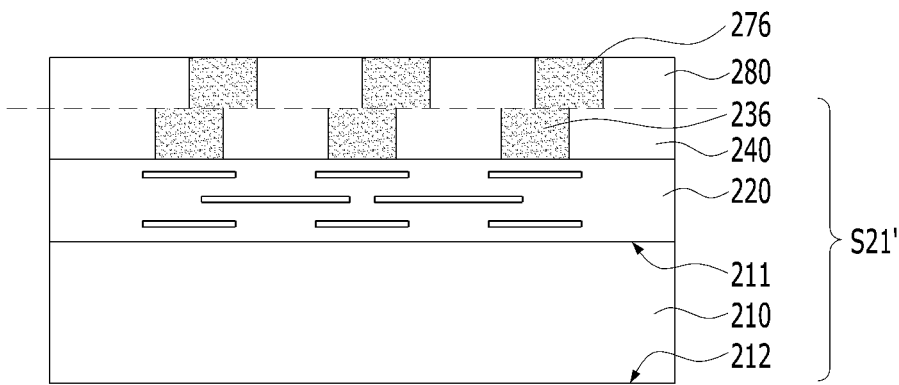

Referring to FIG. 2C, a planarization process may be performed to expose the upper surface of the second sacrificial pad 276. The planarization process may include a grinding process, a polishing process, such as chemical mechanical polishing (CMP), or a combination thereof.

During this process, a second bonding dielectric layer 280 may be formed by removing a portion of the second surface 282 of the initial second bonding dielectric layer 280'. The thickness of the second bonding dielectric layer 280 may be substantially the same as that of the second sacrificial pad 276.

Figure 2D:
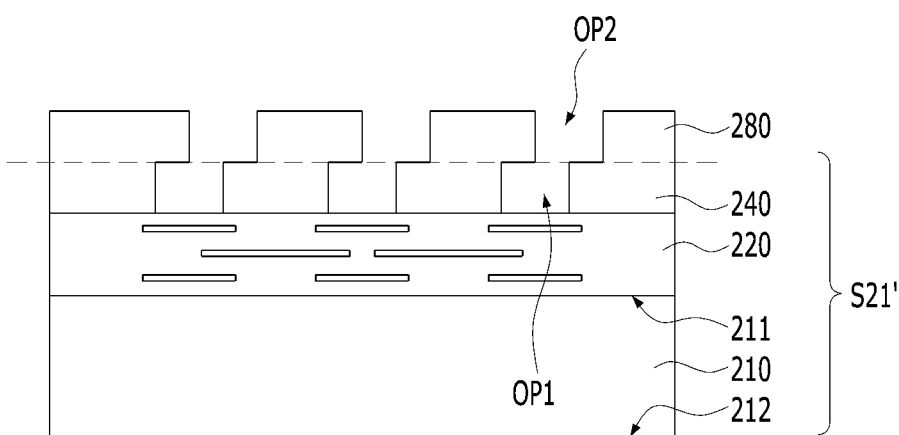

Referring to FIG. 2D, the second sacrificial pad 276 and the first sacrificial pad 236 may be removed. The removal of the second sacrificial pad 276 and the first sacrificial pad 236 may be performed by a stripping process using a wet chemical.

As a result of this process, an empty space from which the second sacrificial pad 276 and the first sacrificial pad 236 were removed may be formed. The empty space that is formed by removing the first sacrificial pad 236 may be hereinafter referred to as a first opening OP1, and the empty space that is formed by removing the second sacrificial pad 276 may be hereinafter referred to as a second opening OP2. Since the first sacrificial pad 236 and the second sacrificial pad 276 may at least partially contact each other, the first opening OP1 and the second opening OP2 may be connected to each other.

Even though the second sacrificial pad 276 and the first sacrificial pad 236 are removed, since an insulator-to-insulator bonding is formed between the first bonding dielectric layer 240 and the second bonding dielectric layer 280 based on a covalent bond between dielectric materials, the coupling between the initial first semiconductor structure S21' and the second bonding dielectric layer 280 can be maintained.

Figure 2E:
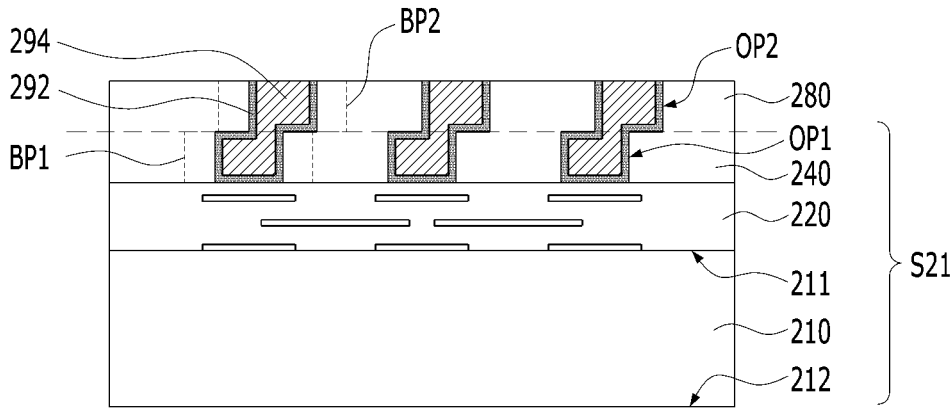

Referring to FIG. 2E, a diffusion barrier layer 292 may be formed along the inner walls of the first and second openings OP1 and OP2, and a metal-containing layer 294 may be formed to fill the remaining space of the first and second openings OP1 and OP2 having the diffusion barrier layer 292 formed thereon.

The formation of the diffusion barrier layer 292 and the metal-containing layer 294 may include forming a diffusion barrier material for forming the diffusion barrier layer 292 over the resultant structure of FIG. 2D along the lower profile with a relatively thin thickness that does not completely fill the first and second openings OP1 and OP2, forming a metal-containing material for forming the metal-containing layer 294 over the diffusion barrier material with a thick thickness that completely fill the first and second openings OP1 and OP2, and then performing a planarization process, e.g., chemical mechanical polishing (CMP), until the upper surface of the second bonding dielectric layer 280 is exposed.

The diffusion barrier layer 292 may include a material capable of preventing the diffusion of the metal contained in the metal-containing layer 294, such as for example, tantalum (Ta), titanium nitride (TiN), tantalum nitride (TaN), or tungsten nitride (WN), ruthenium oxide ($RuO_2$), tantalum silicon nitride (TaSiN), titanium silicon nitride (TiSiN), tungsten boron nitride (TBN), cobalt tungsten boride (CoWB), or combinations thereof. The metal-containing layer 294 may include a low-resistance metal material, such as for example copper (Cu), nickel (Ni), tin (Sn), gold (Au), silver (Ag), a combination thereof, or a compound thereof.

For the sake of convenience in description, the diffusion barrier layer 292 and the metal-containing layer 294 of the first opening OP1 can form the first bonding pad BP1, and the diffusion barrier layer 292 and the metal-containing layer 294 of the second opening OP2 can form the second bonding pad BP2. In this case, the first bonding pad BP1 and the second bonding pad BP2 may be formed to be integrated. In other words, there may be no interface or boundary between the first bonding pad BP1 and the second bonding pad BP2.

According to one embodiment of the present disclosure, since the entire surface except for the upper surface of the metal-containing layer 294 is surrounded by the diffusion barrier layer 292, diffusion of the metal into the first and second bonding dielectric layers 240 and 280 may be prevented. To be more specific, since the sidewall of the metal-containing layer 294 of the first bonding pad BP1 is surrounded by the diffusion barrier layer 292 of the first bonding pad BP1, contact to the first bonding dielectric layer 240 may be prevented. Also, among the upper surface of the metal-containing layer 294 of the first bonding pad BP1, since the remaining portion except for the portion that is integrally connected to the metal-containing layer 294 of the second bonding pad BP2 is covered by the diffusion barrier layer 292 of the first bonding pad BP1, contact to the second bonding dielectric layer 280 may be blocked. Also, since the sidewall of the metal-containing layer 294 of the second bonding pad BP2 is surrounded by the diffusion barrier layer 292 of the second bonding pad BP2, the contact to the second bonding dielectric layer 280 may be blocked. Also, since the diffusion barrier layer 292 is positioned below the remaining portion except for the portion that is integrally connected to the metal-containing layer 294 of the first bonding pad BP1 among the bottom surface of the metal-containing layer 294 of the second bonding pad BP2, contact to the first bonding dielectric layer 240 may be blocked. Also, since the metal-containing layer 294 of the first bonding pad BP1 and the metal-containing layer 294 of the second bonding pad BP2 are integrally formed, the contact resistance between the first bonding pad BP1 and the second bonding pad BP2 may be prevented from increasing.

As a result of this process, the formation of the first semiconductor structure S21 including the first semiconductor substrate 210, the first circuit 220, the first bonding pad BP1, and the first bonding dielectric layer 240 may be completed.

Figure 2F:
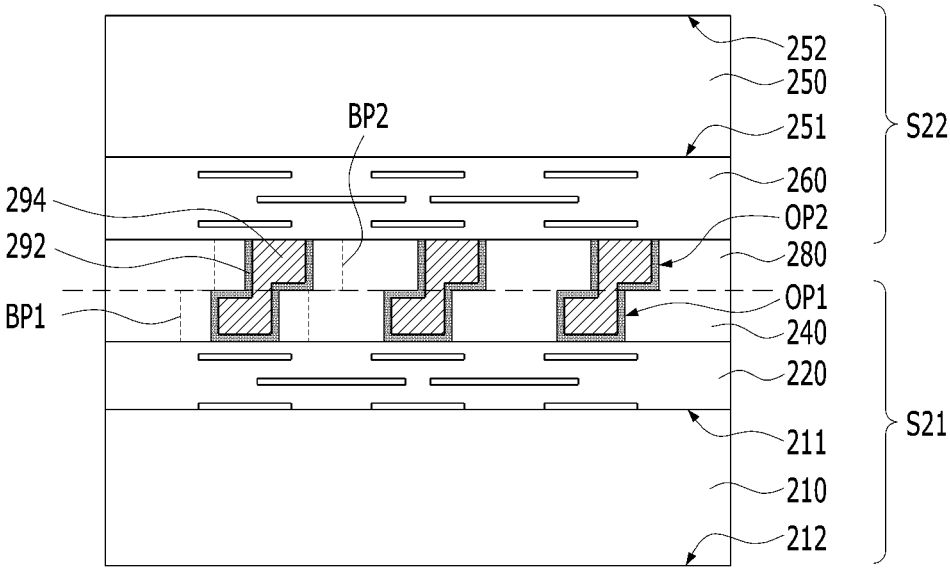

Referring to FIG. 2F, a semiconductor device including the second semiconductor structure S22 that is positioned over first semiconductor structure S21 may be formed by further forming the other constituent elements that are required for forming the second semiconductor structure S22 over the second bonding pad BP2 and the second bonding dielectric layer 280.

For example, a second circuit 260 and a second semiconductor substrate 250 may be formed over the second bonding pad BP2 and the second bonding dielectric layer 280. The second semiconductor substrate 250 may be positioned with a front surface 251 facing downward and a rear surface 252 facing upward. Thus, the second circuit 260 may be positioned below the second semiconductor substrate 250 to be adjacent to the front surface 251. Also, if necessary, the second circuit 260 may be formed to be electrically connected to the second bonding pad BP2.

Consequently, the semiconductor device as illustrated in FIG. 2F may be fabricated.

Referring back to FIG. 2F, the semiconductor device of this embodiment may include the first semiconductor structure S21 and the second semiconductor structure S22 which is positioned over the first semiconductor structure S21.

The first semiconductor structure S21 may include the first semiconductor substrate 210, the first circuit 220 that is positioned over the first semiconductor substrate 210, and the first bonding pad BP1 and the first bonding dielectric layer 240 that are positioned over the first circuit 220. In other words, the first bonding pad BP1 and the first bonding dielectric layer 240 may be positioned in the uppermost portion of the first semiconductor structure S21.

The second semiconductor structure S22 may include the second semiconductor substrate 250, the second circuit 260 below the second semiconductor substrate 250, and the second bonding pad BP2 and the second bonding dielectric layer 280 below the second circuit 260. In other words, the second bonding pad BP2 and the second bonding dielectric layer 280 may be positioned in the lowermost portion of the second semiconductor structure S22.

Here, the first and second bonding dielectric layers 240 and 280 may directly contact and be bonded to each other. The first bonding dielectric layer 240 may include the first opening OP1, and the second bonding dielectric layer 280 may include the second opening OP2 which is connected to the first opening OP1. The diffusion barrier layer 292 may be formed along the inner walls of the first and second openings OP1 and OP2, and the metal containing layer 294 may be formed to fill the remaining space of the first and second openings OP1 and OP2 in which the diffusion barrier layer 292 is formed. The diffusion barrier layer 292 and the metal-containing layer 294 of the first opening OP1 may form the first bonding pad BP1, and the diffusion barrier layer 292 and the metal-containing layer 294 of the second opening OP2 may form the second bonding pad BP2. The diffusion barrier layer 292 may surround the sidewalls of the metal-containing layer 294. Furthermore, when the first bonding pad BP1 and the second bonding pad BP2 are misaligned, a portion of the top surface of the metal-containing layer 294 of the first bonding pad BP1 may face the second bonding dielectric layer 280 with the diffusion barrier layer 292 interposed between them. Also, a portion of the lower surface of the metal-containing layer 294 of the second bonding pad BP2 may face the first bonding dielectric layer 240 with the diffusion barrier layer 292 interposed between them.

Since the constituent elements of the semiconductor device shown in FIG. 2F has already been described in the process of describing the fabrication method, detailed description of those elements will be omitted herein.

Meanwhile, although the case where the embodiment of the present disclosure is applied to a relatively small-sized bonding pad that is connected to a circuit has been described above, the present disclosure is not limited thereto, and the present embodiment may be applied only to a necessary portion of the bonding pad. For example, when misalignment occurs between relatively small bonding pads, the metal diffusion into the bonding dielectric layer may be less than when the misalignment occurs between relatively large bonding pads. For this reason, the present embodiment may be applied not only to a relatively small bonding pad but also to a relatively large bonding pad, for example, a bonding pad that is connected to a through electrode, such as a TSV (Through Silicon Via). This will be exemplarily described with reference to FIGS. 3A to 3E below.

FIGS. 3A to 3E are cross-sectional views illustrating a semiconductor device and a method for fabricating the same in accordance with another embodiment of the present disclosure. Detailed descriptions on the constituent elements that are substantially the same as those of the above embodiment will be omitted herein. First, a method for fabricating a semiconductor 5 device will be described.

Figure 3A:
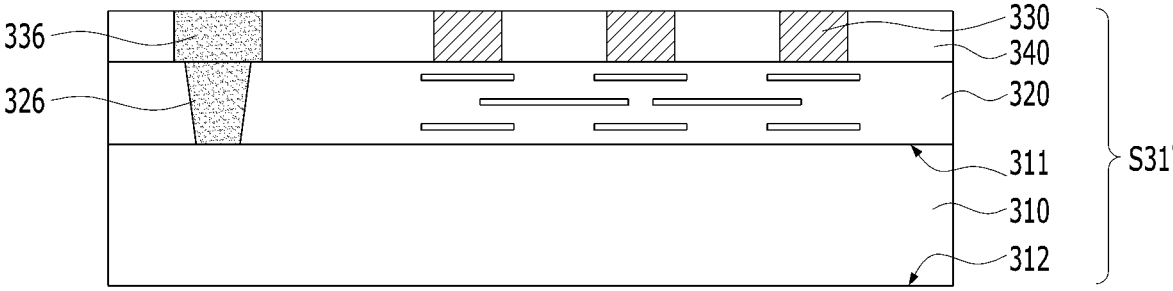
FIGS. 3A to 3E are cross-sectional views illustrating a semiconductor device and a method for fabricating the same in accordance with still another embodiment of the present disclosure.

Referring to FIG. 3A, an initial first semiconductor structure S31' may be provided.

The initial first semiconductor structure S31' may include a first semiconductor substrate 310 having a front surface 311 facing upward, a rear surface 312 facing downward, and side surfaces connecting the front surface 311 and the rear surface 312 to each other, a first circuit 320 formed over the front surface 311 of the first semiconductor substrate 310, and a first additional bonding pad 330 and a first bonding dielectric layer 340 that are formed over the first circuit 320. Furthermore, the initial first semiconductor structure S31' may be positioned at the same level as the first additional bonding pad 330 in a vertical direction. The initial first semiconductor structure S31' may further include a first sacrificial pad 336 that is positioned on a first side of a region where a plurality of the first additional bonding pads 330 are arranged, and a first sacrificial through electrode 326 that passes through the first circuit 320 below the first sacrificial pad 336 and is connected to the first semiconductor substrate 310. Hereinafter, the term 'additional' is used to distinguish the bonding pad which is denoted by the reference numeral '330' from a first bonding pad (see BP1' in FIG. 3E), which will be described later. The first additional bonding pad 330 may be electrically connected to the first circuit 320.

The first sacrificial through electrode 326 may be formed by forming the first circuit 320, selectively etching the dielectric material of the first circuit 320 so as to form a hole that exposes the first semiconductor substrate 310, and filling the hole with a sacrificial material. Herein, in one embodiment, the dielectric material may be etched by an anisotropic etching process, and because of this, the first sacrificial through electrode 326 may have a tapered shape whose width decreases as it goes top to bottom. The first sacrificial through electrode 326 may be replaced with a first through electrode during the subsequent process, and may be formed of a material that may be removed by a chemical or the like. For example, the first sacrificial through electrode 326 may include for example a metal material, such as tungsten (W) or a metal nitride, such as titanium nitride (TiN), which may be removed by a stripping process using a wet chemical. Also, according to this embodiment of the present disclosure, the bottom surface of the first sacrificial through electrode 326 is illustrated to be positioned at substantially the same level as the top surface of the first semiconductor substrate 310, that is, the front surface 311, but the present disclosure is not limited thereto. The first sacrificial through electrode 326 may have a shape penetrating all or part of the first semiconductor substrate 310. In this case, the bottom surface of the first sacrificial through electrode 326 may be positioned at a level between the front surface 311 and the rear surface 312 of the first semiconductor substrate 310, or may be positioned at substantially the same level as the bottom surface of the first semiconductor substrate 310, that is, the rear surface 312.

The first sacrificial pad 336, the first additional bonding pad 330, and the first bonding dielectric layer 340 may be formed by depositing a dielectric material for forming the first bonding dielectric layer 340 over the first circuit 320 and the first sacrificial through electrode 326, selectively etching the deposited dielectric material so as to form a space where the first additional bonding pad 330 is to be formed and a space where the first sacrificial pad 336 is to be formed, and then filling the space where the first additional bonding pad 330 is to be formed with a metal-containing material and filling the space where the first sacrificial pad 336 is to be formed with a sacrificial material. The metal-containing material for forming the first additional bonding pad 330 may include a metal material that may be diffused through a high-temperature annealing process, such as for example copper (Cu), nickel (Ni), tin (Sn), gold (Au), silver (Ag), a combination thereof, or a compound thereof. Furthermore, a diffusion barrier layer may be further formed to surround at least the side surfaces of the first additional bonding pad 330. The first sacrificial pad 336 may be replaced with the first bonding pad in the subsequent process, and may be formed of a material that may be removed by a chemical or the like. For example, the first sacrificial pad 336 may include a metal material, such as tungsten (W) or a metal nitride, such as titanium nitride (TiN), which may be removed by a stripping process using a wet chemical. The first sacrificial pad 336 may include the same material as that of the first sacrificial through electrode 326.

Figure 3B:
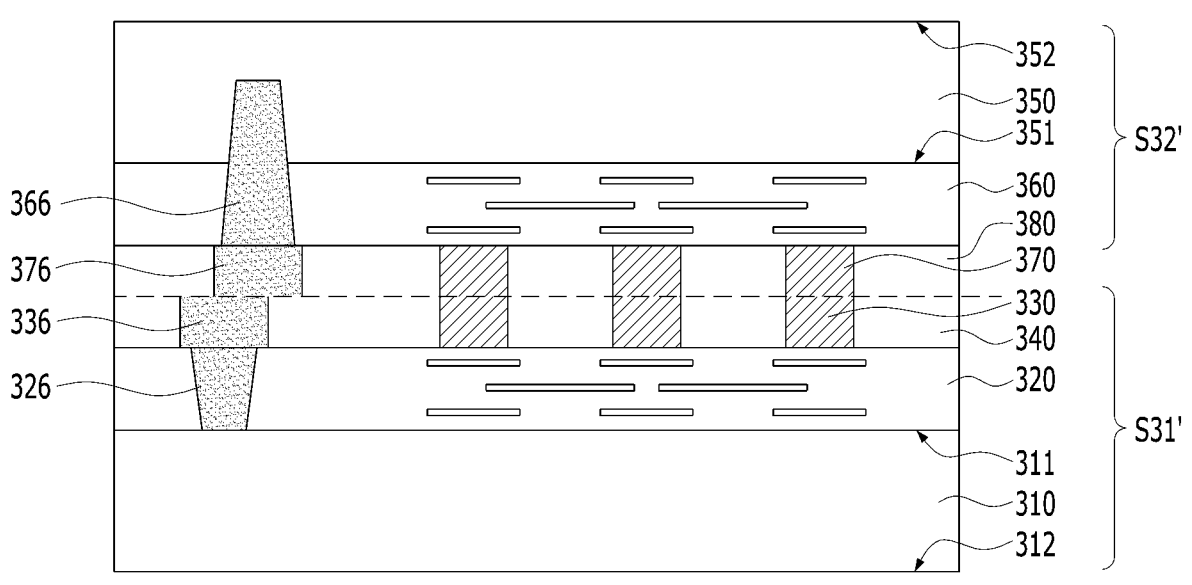

Referring to FIG. 3B, an initial second semiconductor structure S32' may be formed over the initial first semiconductor structure S31'.

The initial second semiconductor structure S32' may include a second semiconductor substrate 350 having a rear surface 352 facing upward, a front surface 351 facing downward, and side surfaces connecting the rear surface 352 and the front surface 351 to each other, a second circuit 360 that is formed below the front surface 351 of the second semiconductor substrate 530, and a second additional bonding pad 370 and a second bonding dielectric layer 380 that are formed below the second circuit 360. Furthermore, the initial second semiconductor structure S32' may further include a second sacrificial pad 376 that is positioned at the same level as the second additional bonding pad 370 in the vertical direction and positioned on a first side of a region where a plurality of the second additional bonding pad 370 are arranged, and a second sacrificial through electrode 366 that is connected to the second semiconductor substrate 350 by penetrating the second circuit 360 in the uppermost portion of the second sacrificial pad 376.

Unlike what is illustrated in the drawing, the second sacrificial through electrode 366 may be formed by forming the second circuit 360 over the front surface 351, selectively etching the dielectric material of the second circuit 360 so as to form a hole that exposes the second semiconductor substrate 350, and filling the hole with a sacrificial material, while the front surface 351 of the second semiconductor substrate 350 faces upward and the rear surface 352 faces downward. Herein, in one embodiment, the dielectric material may be etched by an anisotropic etching process, and because of this, the second sacrificial through electrode 366 may have a tapered shape whose width decreases as it goes bottom to top while the front surface 351 of the initial second semiconductor structure S32' faces downward. The second sacrificial through electrode 366 may be replaced with a second through electrode during the subsequent process, and may be formed of a material that may be easily removed by a chemical or the like. Also, according to one embodiment of the present disclosure, the upper surface of the second sacrificial through electrode 366 is illustrated as being positioned over the lower surface, that is, the front surface 351, of the second semiconductor substrate 350, but the present disclosure is not limited thereto. The upper surface of the second sacrificial through electrode 366 may be positioned at substantially the same level as the front surface 351 of the second semiconductor substrate 350 or may be positioned at substantially the same level as the rear surface 352 of the semiconductor substrate 350 by penetrating the entirety of the second semiconductor substrate 350. When the upper surface of the second sacrificial through electrode 366 is positioned at a higher level than the front surface 351 of the second semiconductor substrate 350, the second circuit 360 is not exposed in the subsequent planarization process (see FIG. 3C). Therefore, it may be advantageous to protect the second circuit 360.

Unlike what is illustrated in the drawing, the second sacrificial pad 376, the second additional bonding pad 370, and the second bonding dielectric layer 380 may be formed by depositing a dielectric material for forming the second bonding dielectric layer 380 over the second circuit 360 and the second sacrificial through electrode 366, selectively etching the deposited dielectric material so as to provide a space where the second additional bonding pad 370 is to be formed and a space where the second sacrificial pad 376 is to be formed, and filling the space where the second additional bonding pad 370 is to be formed with a metal-containing material and the space where the second sacrificial pad 376 is to be formed with a sacrificial material, while the front surface 351 of the second semiconductor substrate 350 faces upward and with the rear surface 352 faces downward. The metal-containing material for forming the second additional bonding pad 370 may include a metal material that may be diffused through a high-temperature annealing process, such as for example copper (Cu), nickel (Ni), tin (Sn), gold (Au), silver (Ag), a combination thereof, or a compound thereof. Furthermore, a diffusion barrier layer surrounding at least a side surface of the second additional bonding pad 370 may be further formed. The second sacrificial pad 376 may be replaced with a second bonding pad during the subsequent process and may be formed of a material that may be removed by a chemical or the like. The second sacrificial pad 376 may include the same material as that of the second sacrificial through electrode 366.

When a heat treatment process is performed while the initial second semiconductor structure S32' is positioned over the initial first semiconductor structure S31', an insulator-to-insulator bonding may be formed between the first bonding dielectric layer 340 and the second bonding dielectric layer 380 based on a covalent bond between dielectric materials, and a metal-to-metal bonding may be formed based on the inter-metal diffusion between the first additional bonding pad 330 and the second additional bonding pad 370, thereby forming a bonding between the initial first semiconductor structure S31' and the initial second semiconductor structure S32'.

Misalignment between the first additional bonding pad 330 and the second additional bonding pad 370 may not occur, and even though misalignment occurs, defects resulting the misalignment, for example, metal diffusion into the first and second bonding dielectric layers 340 and 380 may not be significant.

Meanwhile, unlike the first additional bonding pad 330 which is electrically connected to the first circuit 320, the first bonding pad described below may contact and be connected to the first through electrode having a relatively large planar area, it may have a greater planar area than the first additional bonding pad 330. Similarly, unlike the second additional bonding pad 370 which is electrically connected to the second circuit 360, since the second bonding pad, which will be described later, contacts and is connected to the second through electrode having a relatively large planar area, it may have a greater planar area than the second additional bonding pad 370. For the sake of emphasizing the differences in defects resulting from misalignment, FIG. 3B shows the relatively smaller bonding pads 330, 370 aligned with the larger via-hole sacrificial pads 336, 376 misaligned. In other words, when misalignment occurs between a first bonding pad at a position where the first sacrificial pad 336 exists and a second bonding pad at a position where the second sacrificial pad 376 exists, the defect resulting from the misalignment, for example, metal diffusion into the first and second bonding dielectric layers 340 and 380, may be not be neglectable. For this reason, one embodiment of the present disclosure may be characterized by forming the first sacrificial pad 336 and the second sacrificial pad 376 in advance in the space where the first bonding pad and the second bonding pad are to be formed. Furthermore, the present embodiment may be characterized by forming the first sacrificial through electrode 326 and the second sacrificial through electrode 366 in advance in the space where the first through electrode and the second through electrode are to be formed. The planar areas of the first and second sacrificial pads 336 and 376 may be greater than the planar areas of the first and second additional bonding pads 330 and 370, respectively.

Figure 3C:
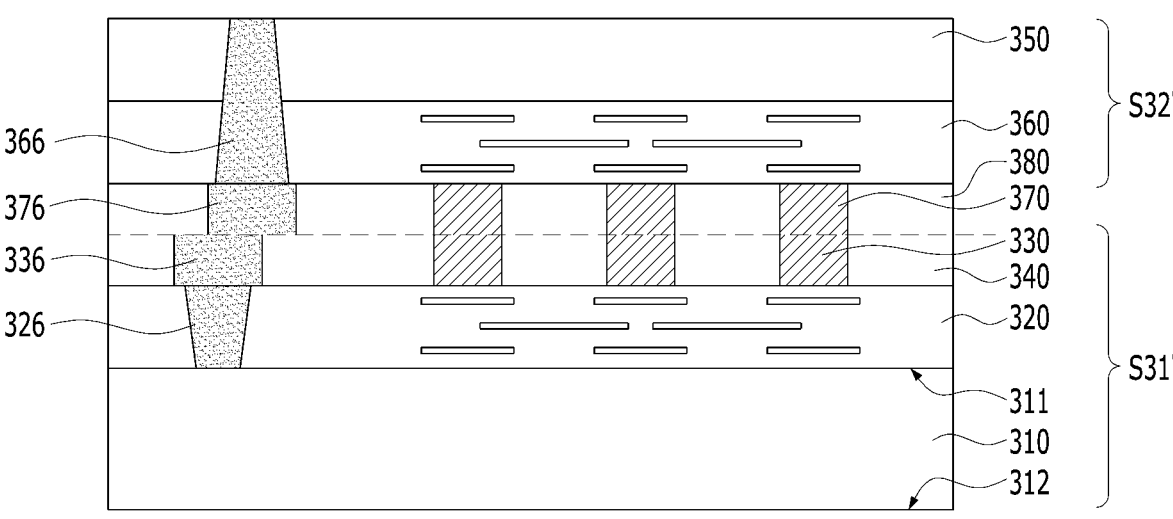

Referring to FIG. 3C, a planarization process may be performed to expose the upper surface of the second sacrificial through electrode 366. The planarization process may include a grinding process, a polishing process, such as CMP, or a combination thereof. When the second sacrificial through electrode 366 completely penetrates the second semiconductor substrate 350 and the upper surface thereof is exposed, this planarization process may be omitted.

During this process, a portion of the rear surface 352 of the second semiconductor substrate 350 may be removed, so that the thickness of the second semiconductor substrate 350 may be reduced.

Figure 3D:
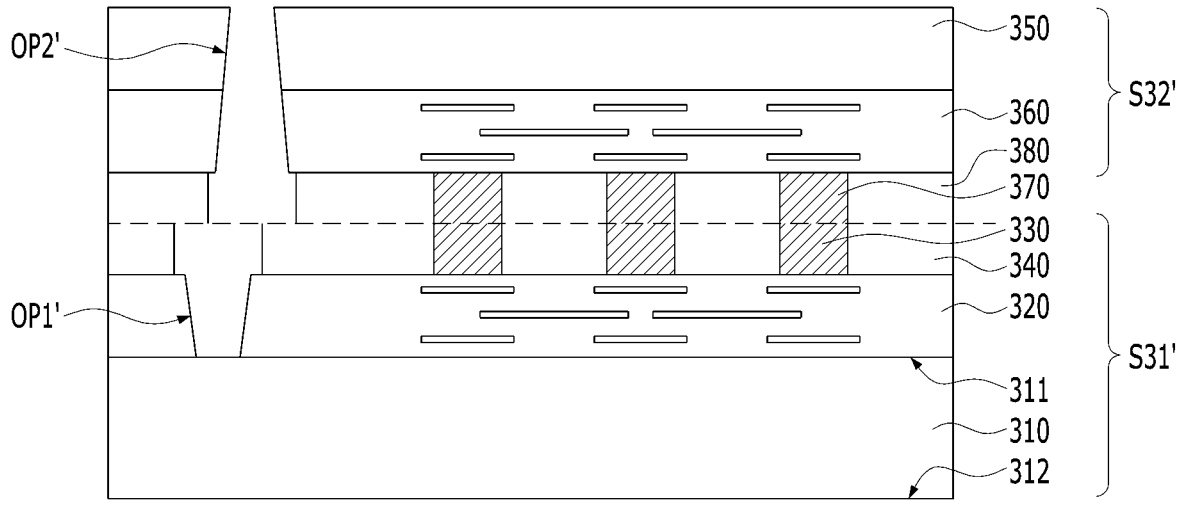

Referring to FIG. 3D, the second sacrificial through electrode 366, the second sacrificial pad 376, the first sacrificial pad 336, and the first sacrificial through electrode 326 may be removed.

As a result of this process, an empty space where the second sacrificial through electrode 366, the second sacrificial pad 376, the first sacrificial pad 336, and the first sacrificial through electrode 326 are removed may be formed. An empty space formed by the removal of the second sacrificial through electrode 366 and the second sacrificial pad 376 hereinafter referred to as a second opening OP2', and an empty space formed by the removal of the first sacrificial pad 336 and the first sacrificial through electrode 326 hereinafter referred to as a first opening OP1'.

Figure 3E:
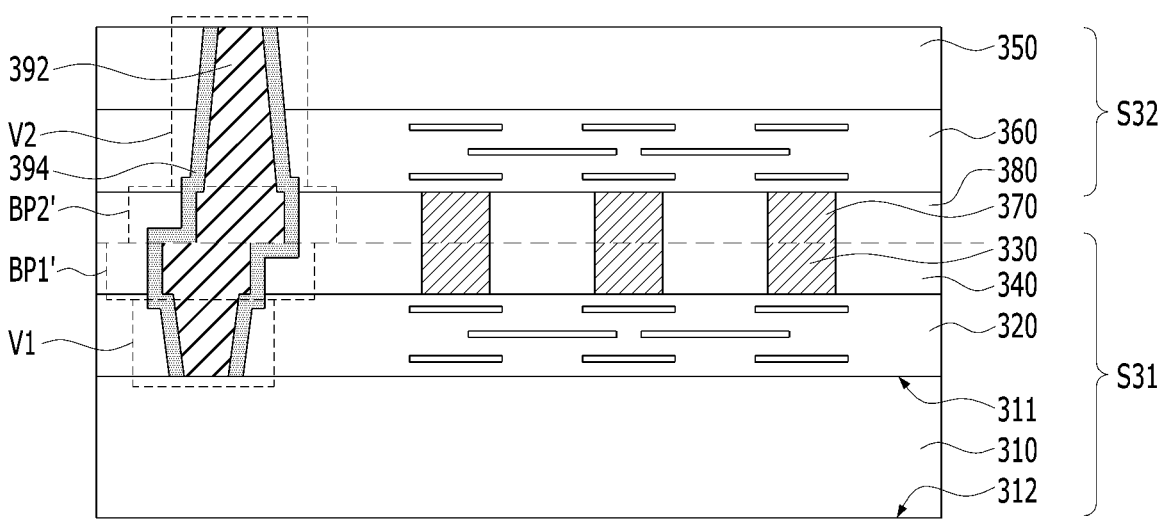

Referring to FIG. 3E, a stacked structure of the first semiconductor structure S31 and the second semiconductor structure S32 may be formed by forming a diffusion barrier layer 394 along the inner walls of the first and second openings OP1' and OP2', and forming a metal-containing layer 392 that fills the remaining spaces of the first and second openings OP1' and OP2' where the diffusion barrier layer 394 is formed.

For the sake of convenience in description, it is assumed that the diffusion barrier layer 394 and the metal-containing layer 392 of the first opening OP1' from which the first sacrificial pad 336 is removed may form the first bonding pad BP1', and that the diffusion barrier layer 394 and the metal-containing layer 392 of the first opening OP1' from which the first sacrificial through electrode 326 is removed may form the first through electrode V1. Also, it may be assumed that the diffusion barrier layer 394 and the metal-containing layer 392 of the second opening OP2' from which the second sacrificial pad 376 is removed may form the second bonding pad BP2' and that the diffusion barrier layer 394 and the metal-containing layer 392 of the second opening OP2' from which the second sacrificial through electrode 366 is removed may form the second through electrode V2. In this case, the first bonding pad BP1' and the second bonding pad BP2' may be integrally formed, that is, may be formed without any interface or boundary between them. Furthermore, the first through electrode V1, the first bonding pad BP1', the second through electrode V2, and the second bonding pad BP2' may be integrally formed.

Consequently, a semiconductor device as illustrated in FIG. 3E can be fabricated.

Referring back to FIG. 3E, the semiconductor device in accordance with this embodiment of the present disclosure may include a first semiconductor structure S31 and a second semiconductor structure S32 that is positioned over the first semiconductor structure S31.

The first semiconductor structure S31 may include the first semiconductor substrate 310, the first circuit 320 over the first semiconductor substrate 310, the first through electrode V1 penetrating at least the first circuit 320, the first additional bonding pad 330, a first bonding dielectric layer 340, and a first bonding pad BP1' over the first circuit 320 and the first through electrode V1. When the first additional bonding pad 330, the first bonding dielectric layer 340, and the first bonding pad BP1' are positioned in the uppermost portion of the first semiconductor structure S31, the first through electrode V1 may penetrate all or part of the first semiconductor structure S31 except for the uppermost portion.

The second semiconductor structure S32 may include the second semiconductor substrate 350, the second circuit 360 below the second semiconductor substrate 350, the second through electrode V2 penetrating at least the second circuit 360, the second additional bonding pad 370, the second bonding dielectric layer 380 and a second bonding pad BP2' below the second circuit 360. When it is assumed that the second additional bonding pad 370, the second bonding dielectric layer 380, and the second bonding pad BP2' are positioned in the lowermost portion of the second semiconductor structure S32, the second through electrode V2 may penetrate the second semiconductor structure S32 except for the uppermost portion of the second semiconductor structure S32. Accordingly, the upper surface of the second through electrode V2 may be exposed, and the upper surface may contact and be connected to another coupling electrode during the subsequent process.

Here, the first and second bonding dielectric layers 340 and 380 may directly contact and be bonded to each other. The first bonding dielectric layer 340 and the first circuit 320 may include a first opening OP1', and the second bonding dielectric layer 380 and the second circuit 360 may include a second opening OP2' that is connected to the first opening OP1'. A diffusion barrier layer 394 may be formed along the inner walls of the first and second openings OP1' and OP2', and a metal-containing layer 392 may be formed to fill the remaining portion of the first and second openings OP1' and OP2' in which the diffusion barrier layer 394 is formed. The diffusion barrier layer 394 and the metal-containing layer

392 of the first opening OP1' may form the first bonding pad BP1' and the first through electrode V1, and the diffusion barrier layer 394 and the metal-containing layer 392 of the second opening OP2' may form the second bonding pad BP2' and the second through electrode V2.

According to one embodiment of the present disclosure, since the entire surface except for the uppermost surface of the metal-containing layer 392 is surrounded by the diffusion barrier layer 394, diffusion of metal into the first and second bonding dielectric layers 340 and 380 may be blocked. Also, since the first bonding pad BP1' and the second bonding pad BP2' are integrally formed, the contact resistance between the first bonding pad BP1' and the second bonding pad BP2' may increase. Furthermore, since the first through electrode V1, the first bonding pad BP1', the second through electrode V2, and the second bonding pad BP2' are integrally formed, the resistance of a current path through them may be reduced, which may facilitate the transmission of power or signals.

Since the detailed description on the constituent elements of the semiconductor device shown in FIG. 3E has already been described in the process of describing the method for fabricating the semiconductor device, further description of those elements will be omitted.

According to one embodiment of the present disclosure, it is possible to provide a semiconductor device capable of having excellent electrical connection characteristics of a bonding pad that connects two semiconductor structures while preventing metal diffusion from the bonding pad to a bonding dielectric layer, and a method for fabricating the same.

While the present disclosure has been described with respect to the specific embodiments, it will be apparent to those skilled in the art that diverse changes and modifications may be made without departing from the scope of the disclosed invention.

What is claimed is:

1. A semiconductor device, comprising:
a first semiconductor structure including a first bonding dielectric layer that is positioned in an uppermost portion of the first semiconductor structure and that includes a first opening;
a second semiconductor structure positioned over the first semiconductor structure and including a second bonding dielectric layer that is positioned in a lowermost portion of the second semiconductor structure and that includes a second opening connected to the first opening;
a diffusion barrier layer formed along inner walls of the first and second openings; and
a metal-containing layer filling the first and second openings where the diffusion barrier layer is formed,
wherein the first opening extends from the first bonding dielectric layer to penetrate at least a portion of the first semiconductor structure, and
the second opening extends from the second bonding dielectric layer to penetrate at least a portion of the second semiconductor structure.

2. The semiconductor device of claim 1, wherein the first bonding dielectric layer and the second bonding dielectric layer directly contact each other to form an insulator-to-insulator bonding.

3. The semiconductor device of claim 1, wherein the diffusion barrier layer surrounds a sidewall of the metal-containing layer.

4. The semiconductor device of claim 1, wherein a first portion of an upper surface of the metal-containing layer that is buried in the first opening faces the second bonding dielectric layer, and
the diffusion barrier layer is interposed between the second bonding dielectric layer and the first portion.

5. The semiconductor device of claim 1, wherein a first portion of a bottom surface of the metal-containing layer buried in the second opening faces the first bonding dielectric layer, and
the diffusion barrier layer is interposed between the first bonding dielectric layer and the first portion.

6. The semiconductor device of claim 1, wherein the first semiconductor structure includes a first additional bonding pad which is positioned at substantially the same level as the first bonding dielectric layer,
the second semiconductor structure includes a second additional bonding pad which is positioned at substantially the same level as the second bonding dielectric layer,
a planar area of the first opening in the first bonding dielectric layer is greater than a planar area of the first additional bonding pad, and
a planar area of the second opening in the second bonding dielectric layer is greater than a planar area of the second additional bonding pad.

7. A method for fabricating a semiconductor device, comprising:
providing an initial first semiconductor structure that includes first sacrificial pads positioned in an uppermost portion of the initial first semiconductor structure, a first bonding dielectric layer filling a space between the first sacrificial pads, and a first sacrificial through electrode penetrating at least a portion of the initial first semiconductor structure except for the uppermost portion and connected to the first sacrificial pads;
forming an initial second semiconductor structure that includes second sacrificial pads positioned in a lowermost portion of the initial second semiconductor structure, a second bonding dielectric layer filling a space between the second sacrificial pads, and a second sacrificial through electrode penetrating a portion of the initial second semiconductor structure except for the lowermost portion and connected to the second sacrificial pads, over the initial first semiconductor structure;
forming first and second openings by removing the first and second sacrificial pads and the first and second sacrificial through electrodes;
forming a diffusion barrier layer along inner walls of the first and second openings; and
forming a metal-containing layer filling the first and second openings in which the diffusion barrier layer is formed.

8. The method of claim 7, wherein the initial first semiconductor structure further includes a first additional bonding pad formed in the uppermost portion thereof, and
the initial second semiconductor structure further includes a second additional bonding pad formed in the uppermost portion thereof.

9. The method of claim 8, wherein the forming of the initial second semiconductor structure includes:
directly contacting the second bonding dielectric layer to the first bonding dielectric layer, directly contacting the second sacrificial pads to the first sacrificial pads, and directly contacting the first additional bonding pad to the second additional bonding pad; and forming a metal-to-metal bonding between the first additional bonding pad and the second additional bonding pad while forming an insulator-to-insulator bonding between the first bonding dielectric layer and the second bonding dielectric layer by performing a heat treatment process.

10. The method of claim 7, wherein the first sacrificial pads and the second sacrificial pads are misaligned.

\* \* \* \* \*